(12) United States Patent
Zhu

(10) Patent No.: US 7,910,413 B2
(45) Date of Patent: *Mar. 22, 2011

(54) STRUCTURE AND METHOD OF FABRICATING FINFET WITH BURIED CHANNEL

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 386 days.

This patent is subject to a terminal disclaimer.

(21) Appl. No.: 11/961,308

(22) Filed: Dec. 20, 2007

(65) Prior Publication Data

US 2008/0105897 A1 May 8, 2008

Related U.S. Application Data

(63) Continuation of application No. 11/163,687, filed on Oct. 27, 2005, now Pat. No. 7,348,225.

(51) Int. Cl.
*H01L 21/00* (2006.01)
*H01L 21/84* (2006.01)

(52) U.S. Cl. ........ 438/157; 438/156; 438/173; 438/175; 438/176; 438/177; 438/212; 438/282; 438/283; 438/284; 257/365; 257/401

(58) Field of Classification Search .............. 438/156, 438/157, 173, 175–177, 212, 282, 283, 284; 257/401, 365

See application file for complete search history.

(56) References Cited

U.S. PATENT DOCUMENTS

| | | | |
|---|---|---|---|
| 6,475,869 B1 * | 11/2002 | Yu | 438/303 |
| 6,724,008 B2 | 4/2004 | Fitzergald | |
| 6,753,555 B2 | 6/2004 | Takagi et al. | |
| 6,759,712 B2 | 7/2004 | Bhattacharyya | |
| 6,768,156 B1 | 7/2004 | Bhattacharyya | |
| 6,800,892 B2 | 10/2004 | Bhattacharyya | |
| 6,800,905 B2 | 10/2004 | Fried et al. | |
| 6,808,971 B2 | 10/2004 | Bhattacharyya | |
| 6,812,504 B2 | 11/2004 | Bhattacharyya | |
| 6,830,976 B2 | 12/2004 | Fitzgerald | |
| 6,831,292 B2 | 12/2004 | Currie et al. | |
| 6,845,034 B2 | 1/2005 | Bhattacharyya | |
| 6,846,715 B2 | 1/2005 | Fitzgerald et al. | |
| 2003/0201458 A1 | 10/2003 | Clark et al. | |
| 2004/0157353 A1 | 8/2004 | Ouyang et al. | |
| 2005/0116218 A1 | 6/2005 | Yang | |
| 2006/0054969 A1 | 3/2006 | Jang et al. | |
| 2007/0023756 A1 | 2/2007 | Anderson et al. | |

FOREIGN PATENT DOCUMENTS

CN 1643697 A 7/2005

* cited by examiner

*Primary Examiner* — Michael Trinh
*Assistant Examiner* — Bac H Au
(74) *Attorney, Agent, or Firm* — Joseph Abate; Roberts Mlotkowski Safran & Cole, P.C.

(57) ABSTRACT

A method of manufacturing a fin structure comprises forming a first structure of a first material type on a wafer and forming a buried channel of a second material adjacent sidewalls of the first structure. The second material type is different than the first material type. The structure includes a first structure and a buried channel.

19 Claims, 9 Drawing Sheets

STRUCTURE AND METHOD OF FABRICATING FINFET WITH BURIED CHANNEL

CROSS REFERENCE TO RELATED APPLICATIONS

This application is a continuation of U.S. patent application Ser. No. 11/163,687, filed Oct. 27, 2005 now U.S. Pat. No. 7,348,225, the disclosure of which is expressly incorporated by reference herein in its entirety.

BACKGROUND OF INVENTION

1. Field of the Invention

The invention relates generally to a semiconductor structure and method of manufacturing and more particularly to a pFinFET with a buried channel and a method of manufacturing.

2. Background Description

Fin field-effect transistors (FinFETs) are MOSFET double-gate transistors built on an SOI/bulk semiconductor substrate. In implementation, the gate is wrapped around the channel of the FET, forming a double gate structure. The FinFET device has significantly better control of short channel effect and higher or equivalent current density than conventional CMOS technologies, and may be used in almost all types of integrated circuit designs (i.e., microprocessors, memory, etc.).

In particular, the use of the double gate suppresses Short Channel Effects (SCE), provides for lower leakage, provides for more ideal switching behavior, and reduces power consumption. In addition, the use of the double gate increases gate area, which allows the FinFET to have better current control, without increasing the gate length of the device. As such, the FinFET is able to have the current control of a larger transistor without requiring the device space of the larger transistor.

In fabrication processes, high quality relaxed SiGe layers on Si has resulted in the demonstration of FETs with enhanced carrier channels. Also, using Ge in the channel can enhance hole channel mobility. Although the physics of carrier scattering are not known inside short-channel FETs, it is known that the enhanced mobility translates into increased device performance, even at very short gate lengths.

To increase mobility, a buried channel can be used for single gate MOSFET. The buried channel can keep carrier away from scattering of gate dielectric interface and then enhance carrier mobility or MOSFET performance. However, MOSFET with a buried channel has worse SCE than conventional MOSFET due to losing some control of the gate to channel electric potential. It is preferable to use double gate structure for buried channel MOSFET in order to obtain high performance as well as good SCE since double gate MOSFET gives good SCE.

SUMMARY OF THE INVENTION

In a first aspect of the invention, a method of manufacturing a fin structure comprises forming a first structure of a first material type on a wafer and forming a buried channel of a second material type adjacent sidewalls of the first structure. The second material type is different than the first material type.

In another aspect of the invention, the method of forming a structure includes forming a first structure on a wafer comprised of a first material type and forming a second structure of a second material type adjacent at least one sidewall of the first structure. The method further includes forming a layer over one of the first structure and the second structure to form a front gate and a back gate.

In yet another aspect of the invention, a fin structure comprises a first vertical structure of a first material type on a wafer and a buried channel of a second material type, adjacent sidewalls of the first structure. The second material type is different than the first material type.

DESCRIPTION OF THE EMBODIMENTS OF THE INVENTION

The invention relates to a semiconductor structure and method of manufacturing and more particularly to a FinFET device with a buried channel and a method of manufacturing. In one embodiment, the structure of the invention improves the mobility and hence significantly enhances operating frequency and performance of pMOSFETs. Additionally, by using the fabrication methods and hence achieving the final structure of the invention, it is also possible to more accurately gate control to the channel, as well as increase carrier mobility by keeping the carrier from a rough gate dielectric interface and control velocity overshoot close to the source. In one implementation, the thickness of a buried SiGe layer, in the channel, can be controlled through the fabrication process of the invention in order to achieve the beneficial affects of the invention.

Figure 1:
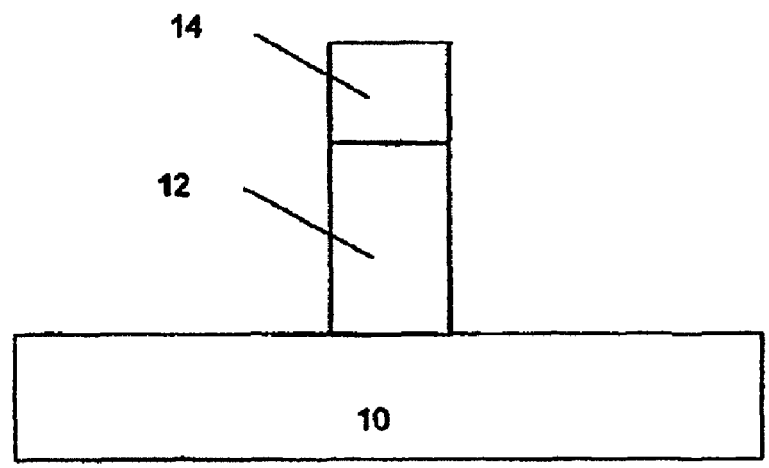
FIGS. 1-8 show an embodiment of process steps for forming a structure in accordance with the invention.

Referring to FIG. 1, a starting structure is shown, which includes a Si fin 12 formed on a BOX 10 (buried oxide). A nitride hardmask 14 is formed over the Si fin 12. The Si fin 12 and nitride hardmask 14 are formed in conventional processes. For example, a Si layer may be bonded to the BOX and nitride film may be deposited on the Si, respectively. The nitride film may then be patterned and etched using RIE (reactive ion etch) processes to form the nitride hardmask 14. The Si layer may also be etched using conventional RIE processes, stopping on the BOX 10.

Figure 2:
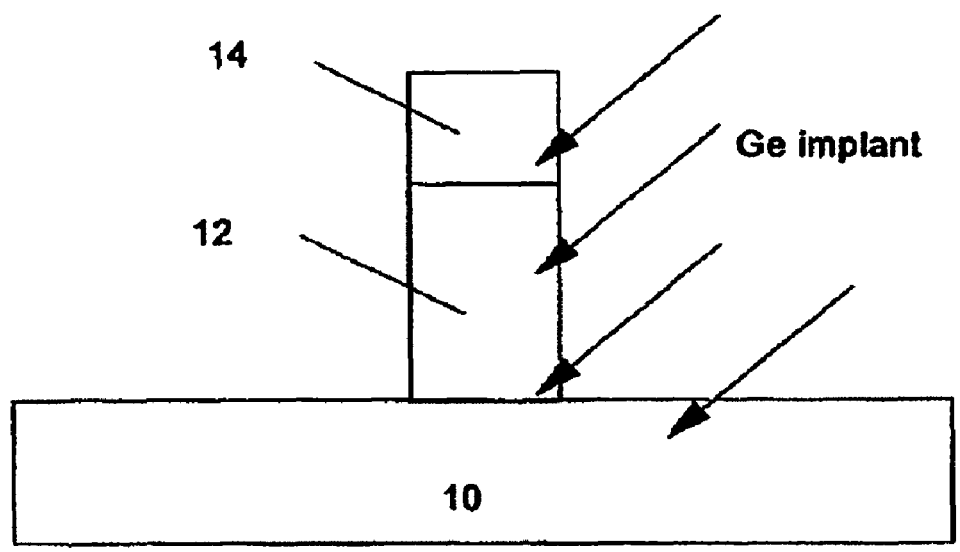

FIG. 2 shows an angle implantation process. In this process, germanium (Ge) is implanted on one side of the structure formed in FIG. 1. In one embodiment, the angle implantation process may be performed on both sides of the structure, as discussed in more detail below. The implantation process is performed on an angle, in the range of approximately 45 degrees; however, other angle implantation processes are also contemplated by the invention. In one embodiment, the implantation energy is about 10 KeV to 30 KeV. The dose of this implantation process may range from about 5e14 to 3e15/cm$^3$. The use of Ge is preferred, in one embodiment, in that subsequent etching steps are selective to the Ge.

Figure 3:
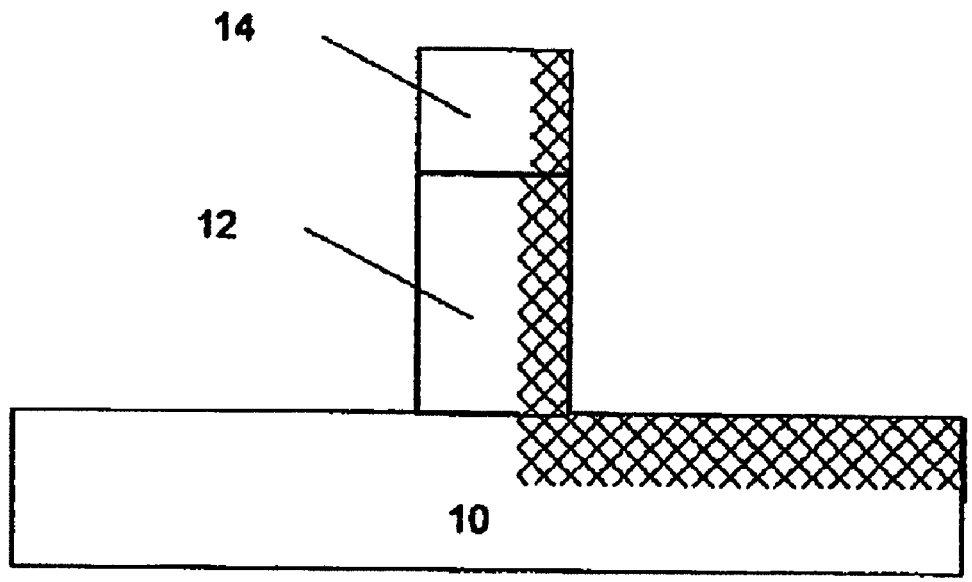

FIG. 3 represents an anneal step to remove the Ge implantation damage caused by the implantation process of FIG. 2.

In FIG. 3, the annealing process may take place in the range of approximately 800° C. to 1100° C.; although other anneal temperatures are also contemplated by the invention.

Figure 4:
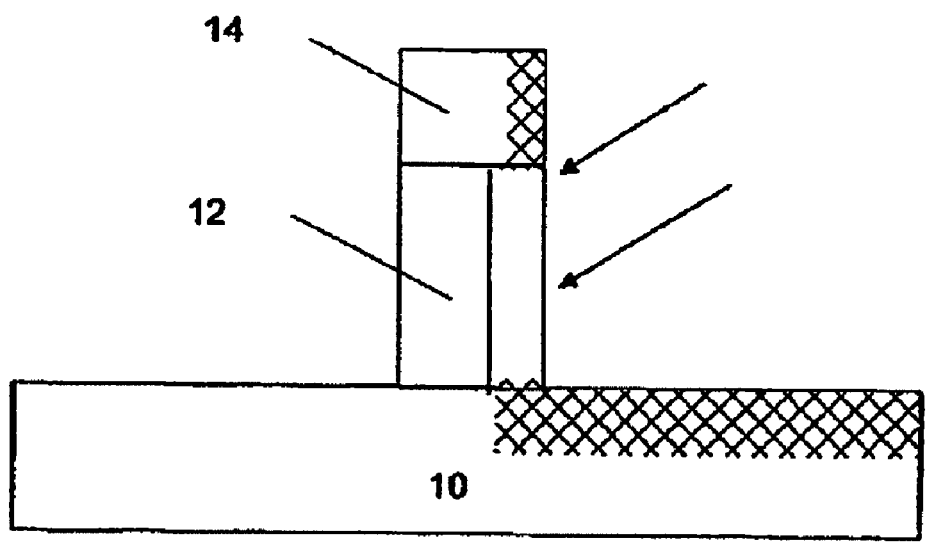

In FIG. 4, the Ge doped Si fin 12 may be etched by an etching process selective to the Si. For example, etching may include $CF_4/CH_2F_2$ or $CF_4/O_2$. It is also contemplated that Ge doped part of the Si fin 12 may be etched using a RIE process or other dry etching, selective to Si. The Ge doped Si fin 12 may be etched in the range of approximately 100 Å to 200 Å, depending on the depth of Ge implantation.

Figure 5:
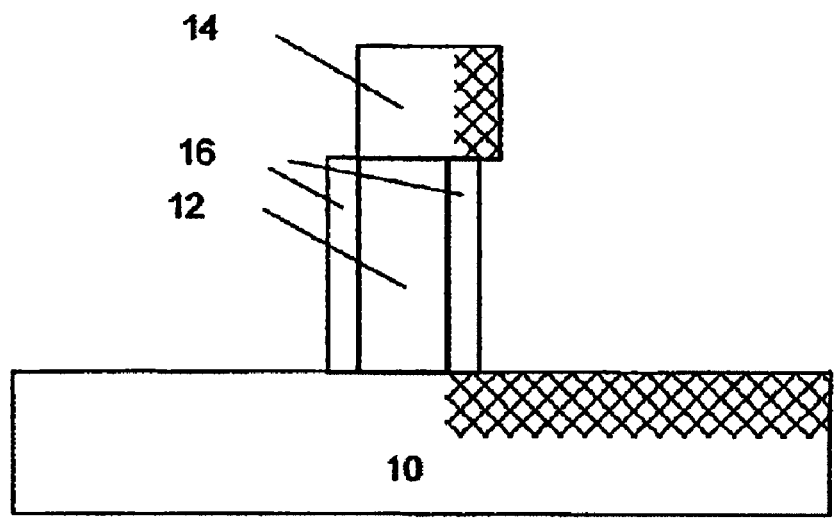

In FIG. 5, an epitaxial SiGe film 16 is deposited or grown on the Si fin 12. In one embodiment, the SiGe film 16 is selective to only Si, such that the SIGe is only deposited or grown on the Si fin 12. It should be understood that the SiGe film 16 has a different matrix than that of the Si fin 12. In one embodiment, the SiGe film 16 may range in thickness from about 20 Å to 50 Å. The SiGe film 16 may be formed using any conventional processes such as, for example, CVD. The SiGe will form the buried channel and, in embodiments, is designed to enhance channel mobility in the channel of the FinFET.

Figure 6:
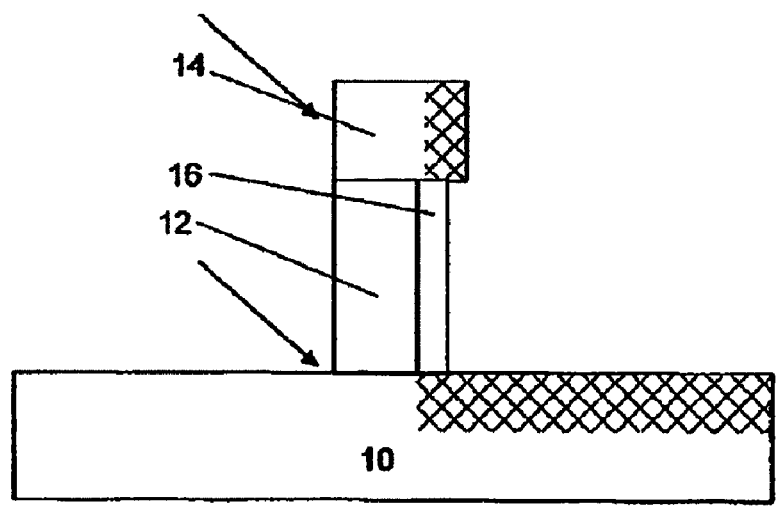

In FIG. 6, since the SiGe on the sidewall of the Si fin 12 is not shadowed by nitride hardmaks, the SiGe film 16 on that sidewall can be selectively etched using an anisotropic etching process. This etching process leaves behind the SiGe film 16 in the channel of the FinFET.

Figure 7:
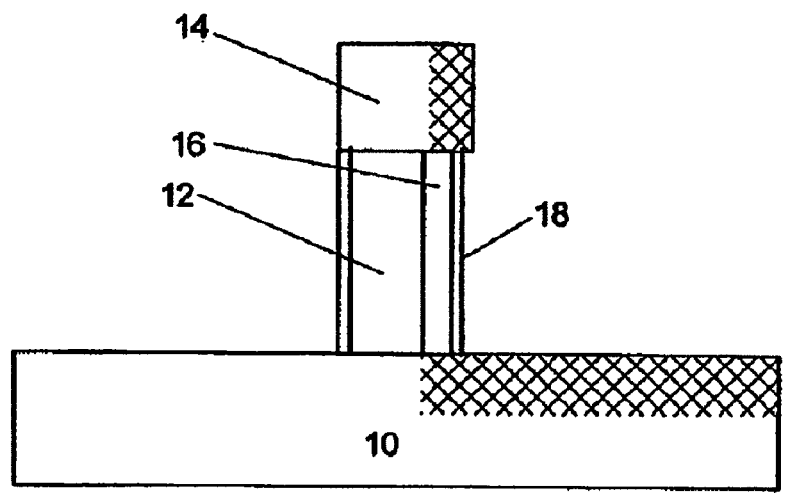

FIG. 7 shows the formation of an epitaxial Si layer 18 formed on the SiGe layer 16. The Si layer 18 has a thickness in the range of, for example, 2 nm to 5 nm. In this structure, the SiGe film 16 is now sandwiched between the Si fin 12 and the Si film 18 to form the basis of a bandgap structure.

Figure 8:
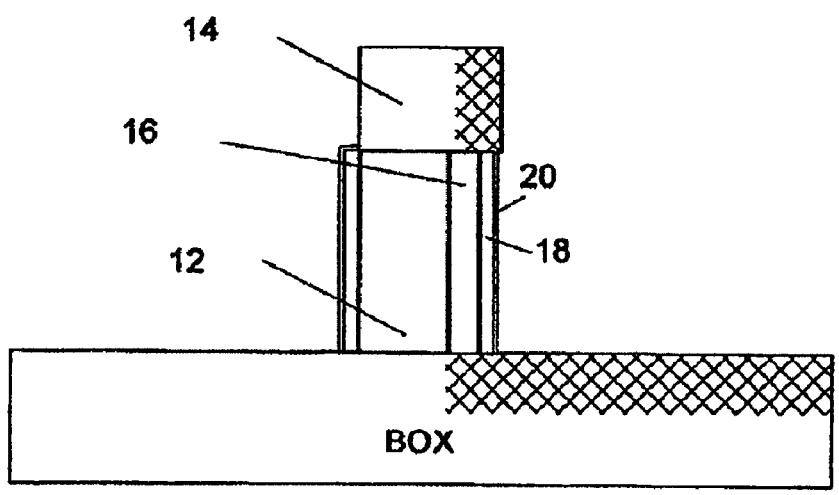

FIG. 8 shows a gate oxidation process. In particular, a gate oxide film 20 is deposited on the sides of the structure of FIG. 7 using conventional processes. In one implementation, a high-k dielectric may be used as a gate dielectric, such as $HfO_2$, $ZrO_2$, $Al_2O_3$, $TiO_2$, $La_2O_3$, $SrTiO_3$, $LaAlO_3$, and mixtures thereof. After this step, conventional FinFET processes may be used to build the FinFET. For example, a poly Si layer may be deposited and etched to form the gate, with an angle implantation process performed to form the extension and halo regions. Thereafter, spacer formation with SD implantation and annealing processes, as one example, may be provided to form the structure.

Figure 9:
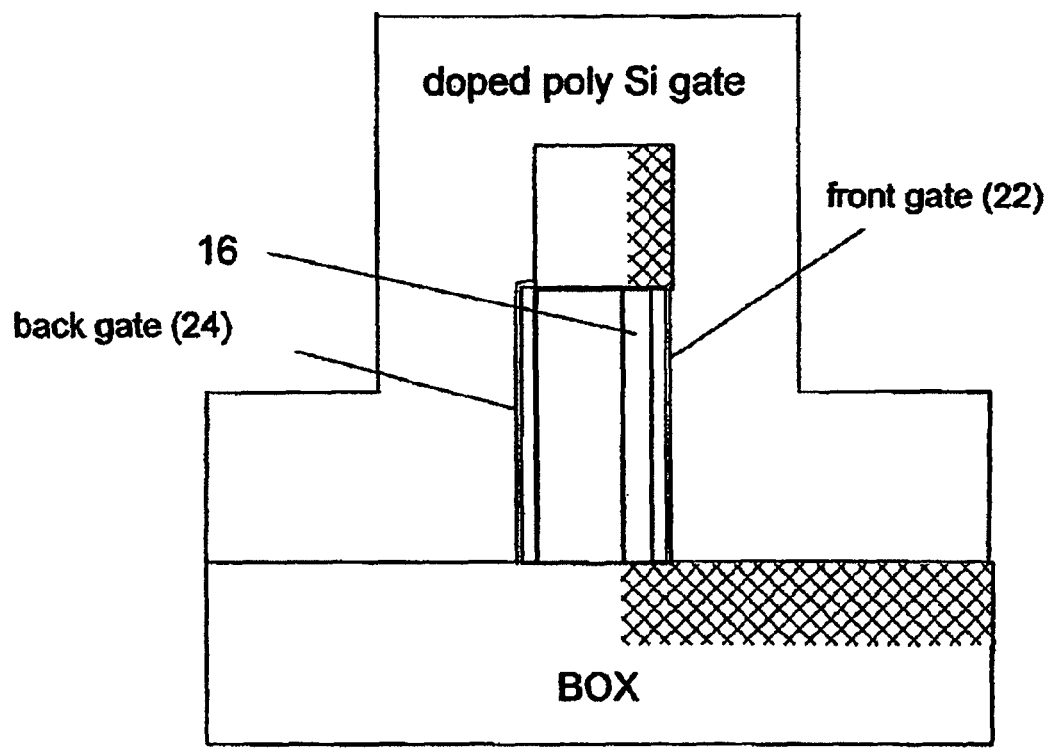
FIG. 9 shows a cross sectional view of a gate using the processes in accordance with the invention.

FIG. 9 represents a cross section of the gate, after the processes of FIG. 8. In FIG. 9, one side of the gate oxide forms the front gate 22, preferably the side with the buried SiGe layer 18. The other side of the gate oxide forms the back gate 24. A doped poly Si gate is provided over the structure.

Figure 10:
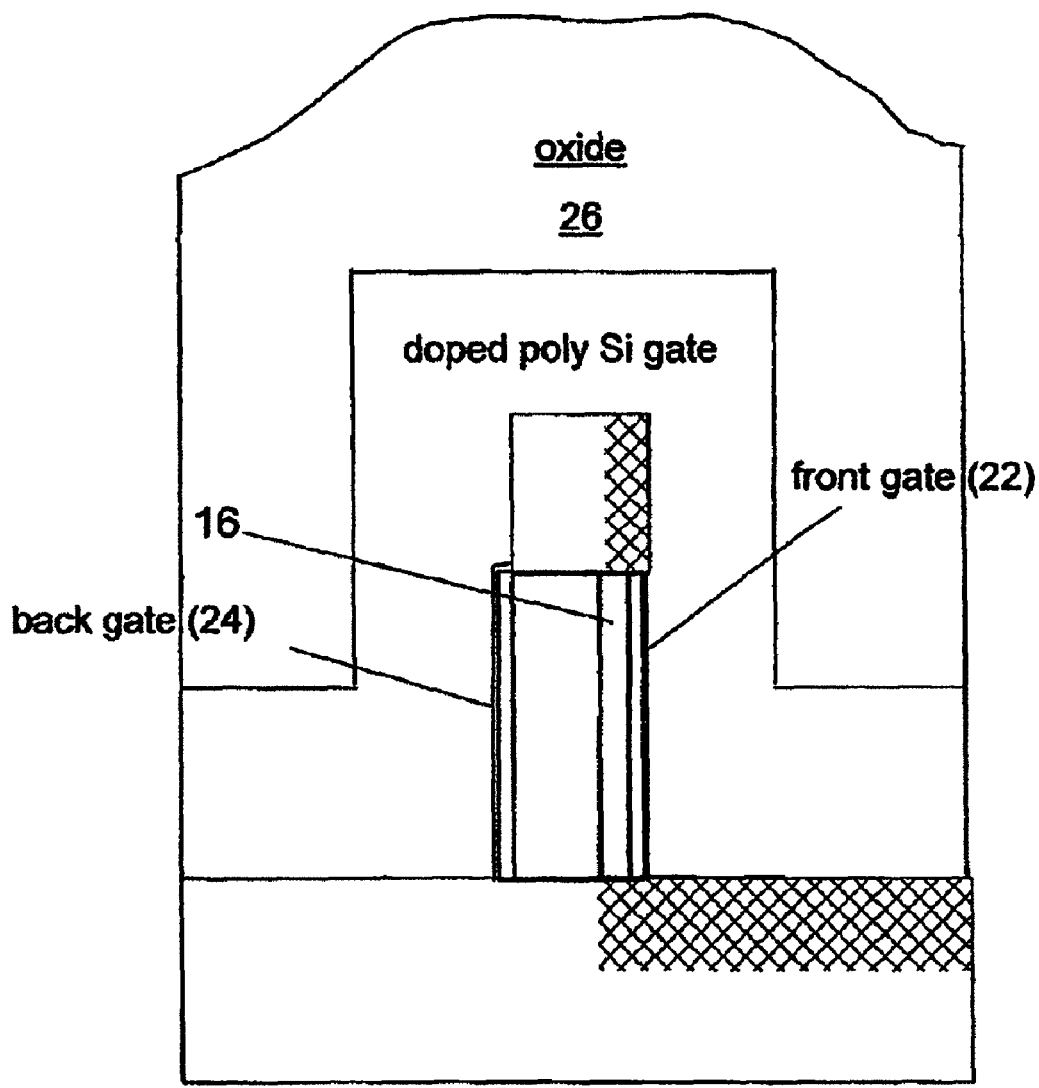
FIG. 10 shows the process of separating the front and back gates in accordance with the invention.
Figure 11:
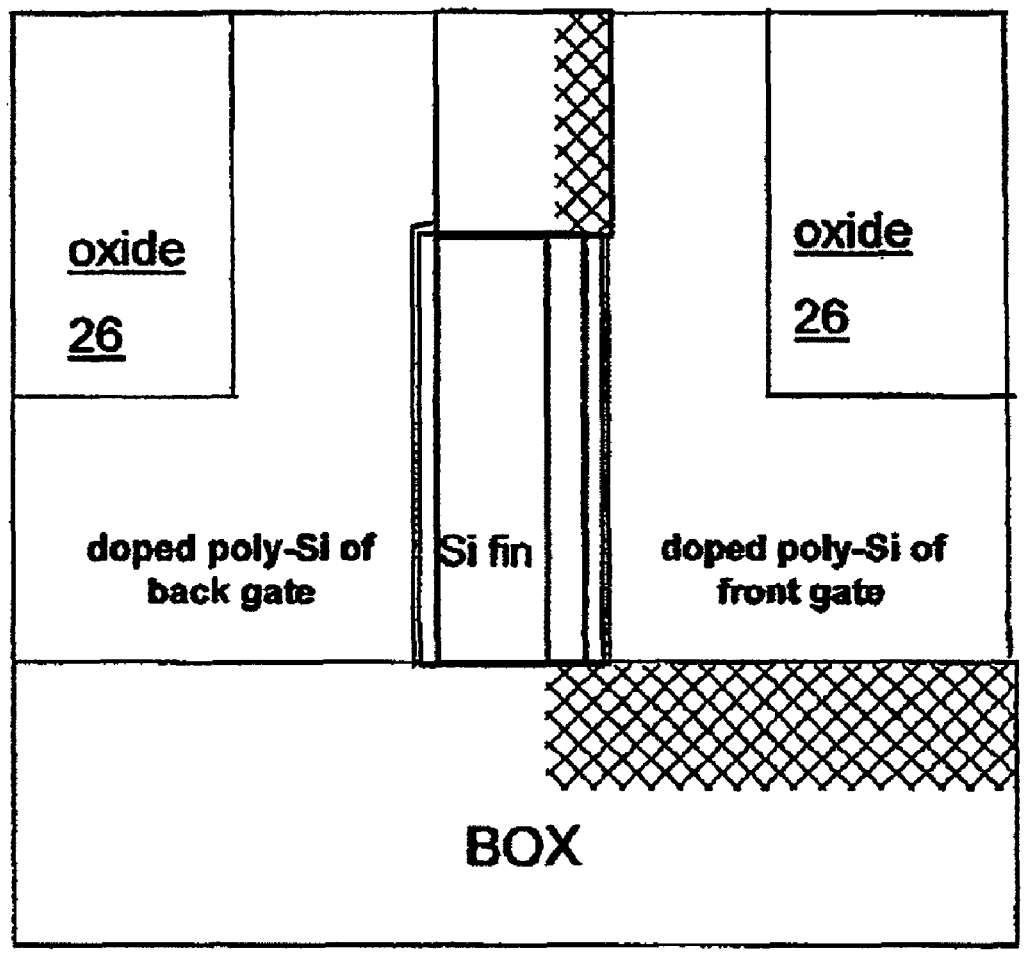
FIG. 11 shows a final structure in accordance with the invention.

FIG. 10 shows the process of separating the front gate 22 and back gate 24 in accordance with the invention. In this process, an oxide 26 is deposited over the structure of FIG. 9. In FIG. 11, as a final structure, the oxide 26 is polished using, for example, chemical mechanical polishing (CMP) stopping at the top of the nitride hardmask 14 to separate the front gate 22 and the back gate 24.

As should be understood, the back gate 24 is used to adjust threshold voltage of the device and the front gate 22 is used to control the electrical current of the device. Also, by having the control to adjust the Ge implantation and SiGe epi process and hence the depth of subsequent selective etching process, it is also possible, using the processes of the invention, to control the thickness of the buried channel, e.g., SiGe buried layer. This provides flexibility in the fabrication process to have the location of the SiGe layer closer to the gate, itself, for gate control.

Figure 12:
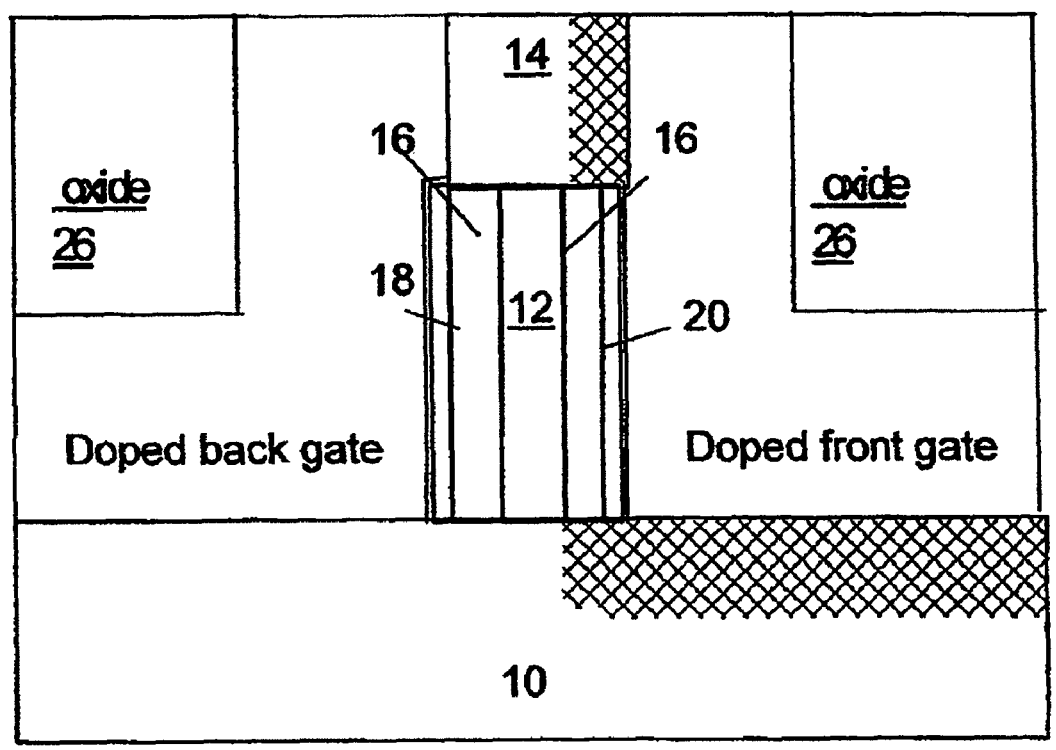
FIG. 12 shows an alternative embodiment in accordance with the invention.

In an alternative process, referring to FIG. 12, the Ge implantation process may take place on both sides of the structure to build a symmetric FinFET. The implantation process is performed on an angle, in the range of approximately 45 degrees; however, other angle implantation processes are also contemplated by the invention. In one embodiment, the implantation energy is about 10 KeV to 30 KeV. The dose of this implantation process may range from about 1e15 to 3e15/cm$^3$. The use of Ge is preferred, in one embodiment, in that subsequent etching steps are selective to the Ge for control.

In the embodiment of FIG. 12, an annealing step will be used to remove the Ge implantation damage caused by the implantation process on both sides of the structure. The Si fin 12 may then be etched, selective to the Ge, using wet or dry etching processes, on both sides to form a symmetrical structure. An epitaxial SiGe film 18 is deposited or grown on the Si fin 12, on both sides, in accordance with above criteria. An epitaxial Si layer 20 is then deposited, sandwiching the SiGe film 18. The epi Si layer 20 may be in the range of approximately 1-2 nm. A gate oxide film 20 is deposited on the sides of the structure using conventional processes. In one implementation, a high-k dielectric may be used as a gate dielectric, such as $HfO_2$, $ZrO_2$, $Al_2O_3$, $TiO_2$, $La_2O_3$, $SrTiO_3$, $LaAlO_3$, and mixtures thereof. After this step, conventional FinFET processes may be used to build the FinFET. The front gate 22 and back gate 24 may then be separated in accordance with the invention, as discussed above.

Figure 13:
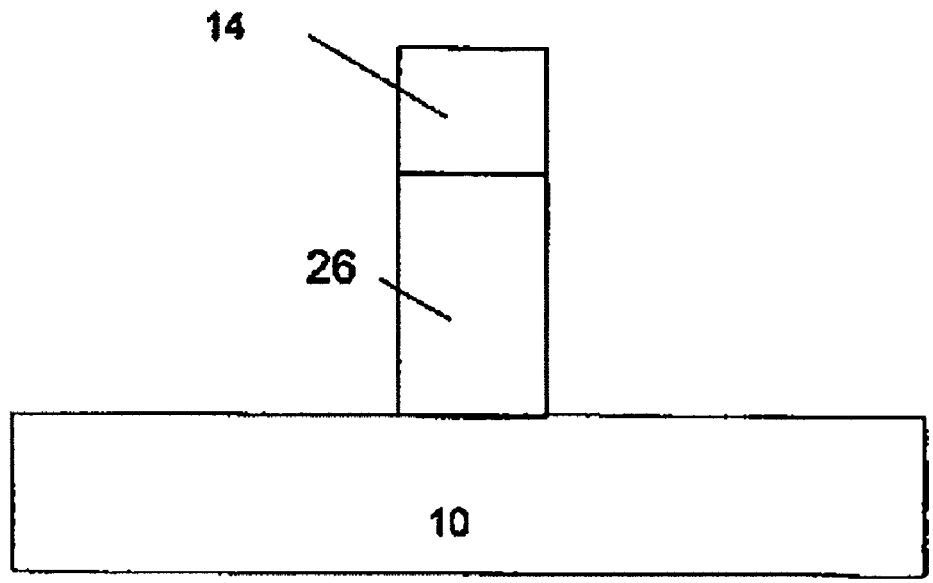
FIGS. 13 and 14 show another embodiment of process steps for forming a structure in accordance with the invention.
Figure 14:
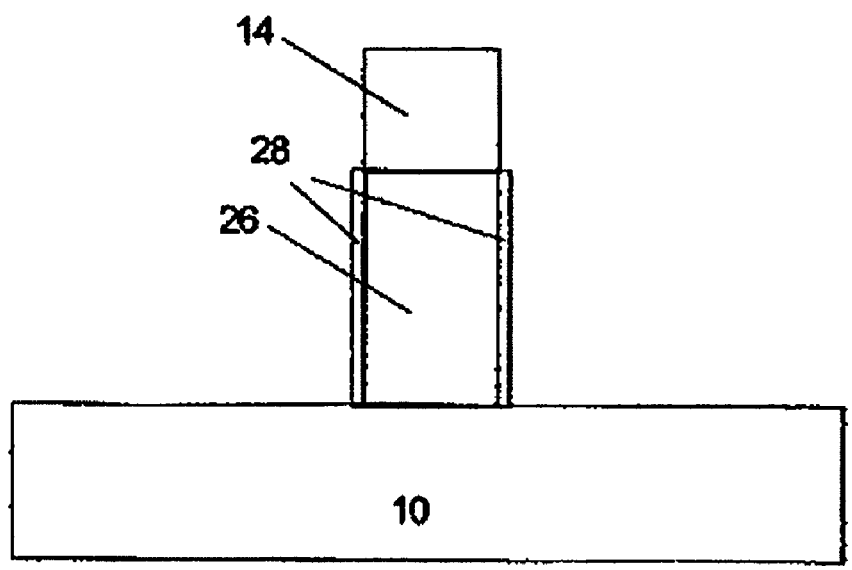

FIGS. 13 and 14 show another embodiment of process steps for forming a structure in accordance with the invention. In the structure of this embodiment, a relaxed SiGe fin 26 is formed on the BOX 10. By way of one example, the relaxed SiGe layer and nitride film, respectively, may be deposited on the BOX 10. The nitride film may then be patterned, and etched using RIE processes to form the nitride hardmask 14. The SiGe layer may also be etched using conventional RIE processes, stopping on the BOX 10, to form the relaxed SiGe fin 26.

In FIG. 14, an epitaxial thin strained Si layer 28 may be grown on the relaxed SiGe fin. The epitaxial Si layer is selective to the SiGe film, and may be a thin layer of approximately 2 nm to 5 nm on the sidewalls of the relaxed SiGe fin 26. Subsequent to the growth of the thin Si layer 28, conventional process steps, as described above, can be used to form the FinFET, starting with, for example, the process steps of FIG. 8.

While the invention has been described with reference to exemplary embodiments, it is understood that the words, which have been used herein, are words of description and illustration, rather than words of limitation. Changes may be made, within the purview of the appended claims, without departing from the scope and spirit of the present invention in its aspects. Thus, although the invention has been described herein with reference to particular materials and embodiments, the invention is not intended to be limited to the particulars disclosed herein; rather, the invention extends to all functionally equivalent structures, methods and uses, such as are within the scope of the appended claims.

What is claimed is:

1. A method of forming a structure, comprising:
   forming a first structure on a wafer comprised of a first material type;
   forming at least one undercut in at least one sidewall of the first structure;
   forming a second structure of a second material type in the at least one undercut and adjacent the at least one sidewall of the first structure;
   forming an Si layer on a sidewall of the second structure; and forming a gate oxide film on a sidewall of the Si layer,
wherein the first material type is Si and the second material type is SiGe.

2. The method of claim 1, wherein the second structure is an epitaxial SiGe film deposited or grown on at least one sidewall of the first structure.

3. The method of claim 2, wherein the SiGe film has a thickness in a range from about 20 Å to 50 Å.

4. The method of claim 1, further comprising forming a poly Si gate contacting a sidewall of the gate oxide film.

5. The method of claim 1 wherein:
the first structure comprises a fin of a finFET;
the at least one undercut in the at least one sidewall comprises a first undercut in a first sidewall of the fin and a second undercut in a second sidewall of the fin; and
the second structure comprises a buried channel of a front gate of the finFET.

6. The method of claim 5, further comprising forming third structure in the second undercut on the second sidewall of the fin, wherein the third structure comprises a buried channel of a back gate of the finFET.

7. The method of claim 1, wherein the at least one sidewall of the first structure comprises a first sidewall on which the second structure is formed, and further comprising:
forming an other Si layer directly on a second sidewall of the first structure; and
forming an other gate oxide film on a sidewall of the other Si layer.

8. The method of claim 7, further comprising:
forming a poly Si front gate on a sidewall of the gate oxide film; and
forming a poly Si back gate on a sidewall of the other gate oxide film.

9. The method of claim 1, wherein:
the first structure comprises a fin of a FinFET; and
the forming the at least one undercut comprises selectively etching a portion of the fin.

10. A method of forming a structure, comprising:
forming a first structure on a wafer comprised of a first material type;
forming at least one undercut in at least one sidewall of the first structure;
forming a second structure of a second material type in the at least one undercut and adjacent the at least one sidewall of the first structure; and
forming a layer over one of the first structure and the second structure to form a front gate and a back gate,
wherein the forming at least one undercut comprises:
implanting a substance at the at least one sidewall of the first structure;
annealing a first portion of the first structure; and
selectively etching a second portion of the first structure.

11. The method of claim 10, wherein the substance comprises Ge.

12. The method of claim 10, wherein the implanting is performed at an angle of approximately 45°.

13. A fin structure, comprising:
a first vertical structure of a first material type on a wafer;
a buried channel of a second material type contacting a sidewall of an undercut of the first structure, the second material type being different than the first material type;
a layer of the first material type formed on a sidewall of the buried channel; and
a gate oxide film formed on the layer.

14. The fin structure of claim 13, wherein one of: the buried channel is SiGe and the first material type is Si.

15. The fin structure of claim 13, further comprising a poly Si gate contacting a sidewall of the gate oxide film.

16. The fin structure of claim 13, further comprising:
a second layer of the first material type contacting a second sidewall of the first structure;
a second gate oxide film contacting a sidewall of the second layer;
a poly Si front gate contacting a sidewall of the gate oxide film; and
a poly Si back gate contacting a sidewall of the second gate oxide film.

17. The fin structure of claim 13, further comprising:
a second buried channel contacting a second undercut sidewall of the first structure;
a second layer of the first material type contacting a sidewall of the second buried channel;
a second gate oxide film contacting a sidewall of the second layer;
a poly Si front gate contacting a sidewall of the gate oxide film; and
a poly Si back gate contacting a sidewall of the second gate oxide film.

18. A fin structure, comprising:
a first vertical structure of a first material type on a wafer;
a buried channel of a second material type adjacent sidewalls of the first structure, the second material type being different than the first material type;
a layer of the first material type formed on a sidewall of the buried channel; and
a gate oxide film formed on the layer,
wherein the second material type is an epitaxial SiGe film deposited or grown on at least one sidewall of the first structure.

19. The fin structure of claim 18, wherein the SiGe film has a thickness in a range from about 20 Å to 50 Å.

* * * * *